(12) United States Patent
Kelkar et al.

(10) Patent No.: US 7,705,620 B2
(45) Date of Patent: Apr. 27, 2010

(54) MEASURING AND IDENTIFYING ANALOG CHARACTERISTICS OF A MICROELECTRONIC COMPONENT AT A WAFER LEVEL AND A PLATFORM LEVEL

(75) Inventors: Mukul Kelkar, West Sacramento, CA (US); Jonathan Kenton, El Dorado Hills, CA (US); Andy Volk, Granite Bay, CA (US); Iris Wong, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 238 days.

(21) Appl. No.: 11/393,468

(22) Filed: Mar. 29, 2006

(65) Prior Publication Data

US 2007/0229106 A1    Oct. 4, 2007

(51) Int. Cl.
*G01R 31/02*    (2006.01)

(52) U.S. Cl. ...................................... 324/763

(58) Field of Classification Search ................. 324/765, 324/754, 761–762, 158.1, 763; 257/48; 438/14, 438/17–18
See application file for complete search history.

(56) References Cited

U.S. PATENT DOCUMENTS

| | | | | |
|---|---|---|---|---|
| 6,747,445 | B2 * | 6/2004 | Fetterman et al. | 324/71.1 |
| 6,844,751 | B2 * | 1/2005 | Marshall et al. | 324/765 |
| 7,307,441 | B2 * | 12/2007 | Sohn et al. | 324/765 |

* cited by examiner

*Primary Examiner*—Ha Tran T Nguyen
*Assistant Examiner*—Tung X Nguyen
(74) *Attorney, Agent, or Firm*—Blakely, Sokoloff, Taylor & Zafman LLP

(57) ABSTRACT

A die includes circuit components to perform normal operations and duplicated components of selective ones of the circuit components. Each end of the duplicated components is connected to a pad on the die to allow access by measurement devices. The measurement devices apply electricity to the pads to measure analog characteristics of the duplicated components.

11 Claims, 5 Drawing Sheets

MEASURING AND IDENTIFYING ANALOG CHARACTERISTICS OF A MICROELECTRONIC COMPONENT AT A WAFER LEVEL AND A PLATFORM LEVEL

BACKGROUND

1. Field

Performance monitoring of microelectronic components at a wafer level and a platform level.

2. Description of Related Art

Microelectronic components, such as transistors, resistors, diodes, capacitors, inductors, and various conductors and insulators, sometimes contain variations caused by the fabrication process. The variations in physical dimensions may produce device characteristics that deviate from the desired target. Such components may cause the die containing the components to have degraded performance or become totally unusable. To save cost, a chip manufacturer is interested in identifying a die that deviates from specified performance at a wafer level before the die is cut off from the wafer and packaged into an integrated chip (IC). Also, after a die is packaged into an IC, it is sometimes desirable to determine whether certain components in the IC satisfy specific requirements, e.g., for diagnostic or debugging purposes.

A wafer level test has been developed to evaluate analog characteristics of a group of dies on a wafer. Test circuits are built in the space between the dies on a wafer. Due to the limited space available, it is generally not possible to build a dedicated test circuit for each die. Thus, results obtained from the test circuits represent an average behavior of the die group instead of a single die. Such results cannot distinguish variations in the characteristics of each individual die within the die group. Moreover, these test circuits often require large dedicated pads to allow access by external measurement devices. Further, the test circuits cannot be reused after chip assembly because they become dissected after the dies are cut from the wafer.

Another approach has been developed to monitor the characteristics of a group of interconnected components within a die. Measurement devices have access to the component group but not the individual component. Thus, different component types with different characteristics (e.g., drain current, threshold voltage, effective channel length, channel width, sheet resistivity, and dielectric characteristics) are often combined into one measurement. Further, when measurements are taken from components connecting to an I/O buffer (which is a combination of multiple components), the results of the measurement are combined characteristics of multiple components including the buffer. Thus, analog characteristics of a single isolated component within a die are usually not available.

BRIEF DESCRIPTION OF THE DRAWINGS

Embodiments are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1:
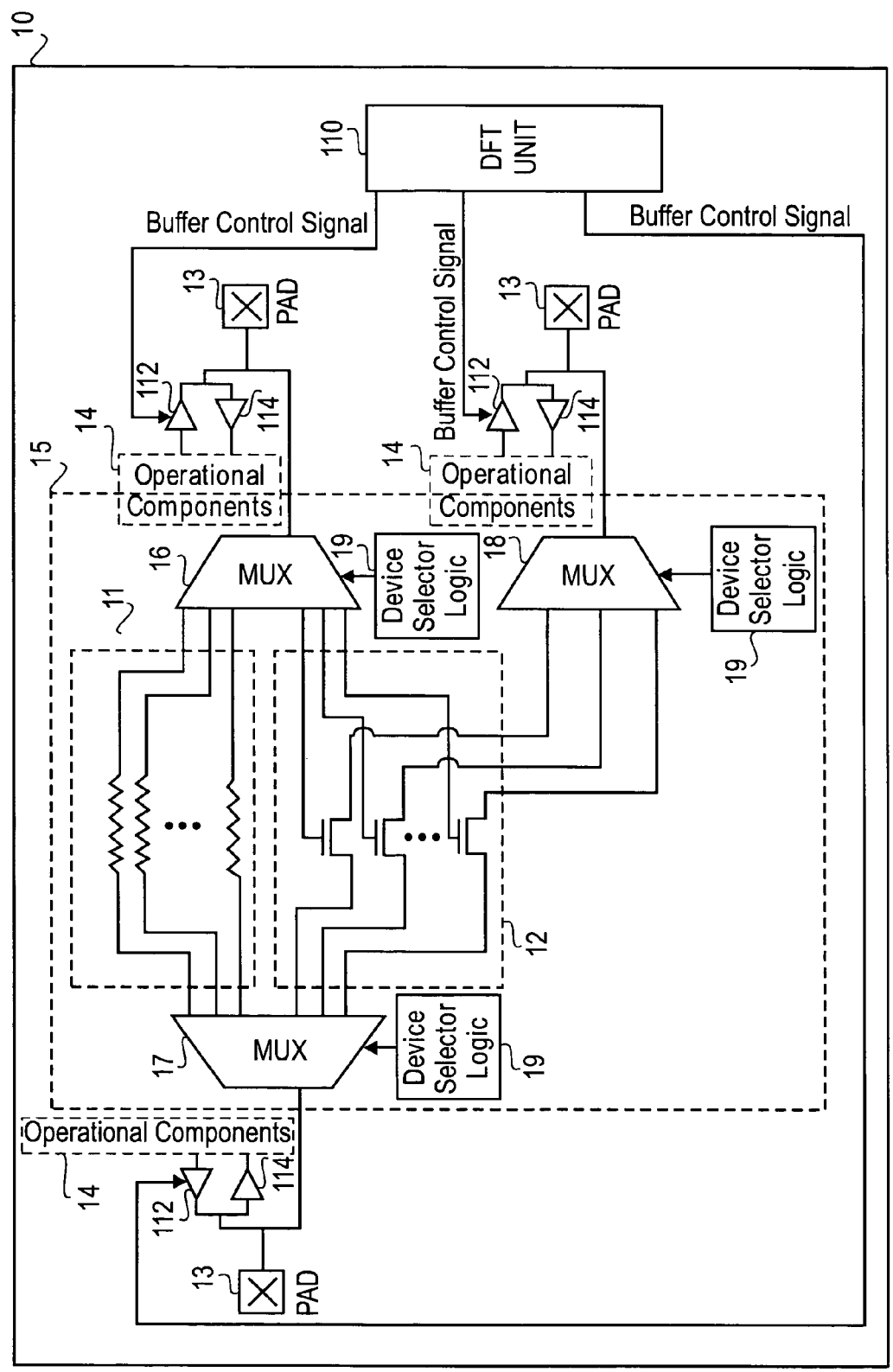
FIG. 1 is a block diagram showing an embodiment of an analog process skew monitor (APSM) embedded within a die.

FIG. 1 shows a monitoring unit 15 embedded within a die 10. Monitoring unit 15 may be referred to as an "analog process skew monitor (APSM)" 15 that can be used to measure analog characteristics of one or more circuit components in die 10. Access to APSM 15 may be made through pads 13 which electrically connect the circuit components to external test or measurement devices. For the purpose of illustration, the size of APSM 15 in relation to die 10 has been exaggerated to show details. Although FIG. 1 shows APSM 15 as including specific components, it should be understood that any circuit component may be included in APSM 15 as desired by a circuit designer or a customer.

In one embodiment, die 10 may be an integrated circuit (IC) in the form of a chip on a wafer, or as part of a packaged IC electrically connected to other components to form an electronic system. In addition to APSM 15, die 10 may include a plurality of interconnected microelectronic circuit components (e.g., transistors, resistors, diodes, capacitors, inductors, conductors, and insulators) to perform normal operations; that is, the operations for which die 10 is specifically designed. These microelectronic components performing normal operations are referred to herein as "operational components" 14. For example, die 10 may be a single-chip central processing unit, a graphic controller, a memory chip, a communication device, or an IC for any general or application-specific purposes.

APSM 15 may include a duplicate of selected operational components. In the embodiment as shown, the selected operational components may include resistors and transistors. In alternative embodiments, the selected operational components may include diodes and capacitors. The duplicated components (the device under test, or DUT) are the components subject to measurements and tests. The duplicated components are not necessarily an exact copy of the corresponding operational components with respect to physical sizes. The key characteristic of the duplicated components is that they are fabricated by the same process as the corresponding operational components. In FIG. 1, resistor duplicates 11 may include one or more resistors duplicated from an operational resistor in die 10. For example, resistor duplicates 11 may include a copy of the operational resistors that have different physical dimensions. Similarly, transistor duplicates 12 may include a copy of the operational transistors that have different physical dimensions (e.g., channel length and/or width). For example, transistors duplicates 12 may include NMOS (N-type metal oxide semiconductor) transistors and PMOS (P-type metal oxide semiconductor) transistors, each with thin or thick gate and with small or large effective channel length (Le). These duplicates are chosen to be the representatives of operational components 14 because the duplicates represent the critical component structures of die 10. Analog characteristics of the duplicates are normally highly correlated to the corresponding operational components, because each duplicate and its corresponding operational component are co-located on the same die and fabricated by the same process at the same time. Thus, if a duplicated component displays a certain characteristic, the corresponding operational component most likely also has the same characteristic. Thus, by measuring the analog characteristics of the duplicated components, the characteristics of the corresponding operational components may be obtained. Moreover, as the duplicated components and the corresponding operational components are fabricated by the same process, the analog characteristics of the duplicated components may serve as an indicator of the quality of the fabrication process that produces the corresponding operational components.

Analog characteristics of the duplicated components may be monitored at the wafer level (before die 10 is cut off from the wafer), at the die level (after the wafer is dissected and each die is packaged) and at a platform level (after die 10 is packaged and interconnected to other components of a system). The analog characteristics may include transistor drive strength, threshold voltage, reverse bias, output resistance, effective output resistance (Rout), and any characteristics measurable from a single isolated microelectronic component. The measured analog characteristics may be plotted in a curve such as IV (current vs. voltage) curve or a VT (current vs. threshold voltage) curve.

In one embodiment, APSM 15 may include a plurality of multiplexers 16, 17, 18 for selecting one of the duplicated components for measurement. Each end of duplicated components 11, 12 is connected to one of multiplexers (muxes) 16, 17, 18. As shown in FIG. 1, each resistor of resistor duplicates 11 may be connected to multiplexer 16 at one end and multiplexer 17 at the other end. Each transistor of transistors duplicates 12 may have its gates connected to multiplexer 16, source connected to multiplexer 17, and drains connected to multiplexer 18. Each multiplexer 16, 17, 18 may be connected to one of pads 13 for connecting to external devices. Each multiplexer 16, 17, 18 may be controlled by a respective device selector logic 19 that generates a mux control signal for the multiplexer to select one of the duplicated components. The mux control signals are coordinated such that the same component is selected by each of multiplexers 16, 17, 18.

When a duplicated component is selected, the connecting multiplexer 16, 17, 18 serves as passgates which provide a signal path connecting the selected duplicated component to one or more of pads 13. Pads 13 may be dedicated for test control or shared with operational components 14 of die 10. Using shared pads 13 may reduce the number of pads required for die 10 and thus reduce the required size of die 10. If pads 13 are shared pads, signal transmissions to operational components 14 may be disabled during the test mode. In one embodiment, operational components 14 are connected to pads 13 through input buffers 112 and output buffers 114. When APSM 15 is enabled, output buffers 114 may be tristated by a buffer control signal generated by a DFT unit (to be described later) to disable operational components 14 from driving shared pads 13. At the same time, input buffers 112 may be also disabled or their outputs logically gated to prevent spurious operation or improper biasing of the input. While the voltages used during test will not greatly exceed the values seen in normal operation, the test voltages may sit at levels that cause the input buffer to draw current or introduce unwanted noise on to the chip.

Die 10 further includes a DFT (Design for Testability) unit 110, which may be activated by an external tester or measurement device (not shown). DFT unit 110 may monitor specific pads at a wafer level and specific pins at a packaged IC level. These pads/pins may be a combination of dedicated test control pads/pins, dedicated normal operational pads/pins, or pads/pins shared by normal operations and test controls. When those pads/pins are in a particular state or a sequence of states, a test mode is triggered in DFT unit 110. DFT unit 110 then uses the pads/pins it is monitoring to direct the test. In one embodiment, APSM 15 is one of the test modes that DFT unit 110 controls. When the APSM mode is selected, I/O pads 13 are controlled by DFT unit 110 to become ports for measuring the duplicated components. Then when these pads/pins are reconfigured to a particular state, DFT unit 110 configures device selector logic 19. When not in the APSM test mode, all APSM components are disabled.

Figure 2A:
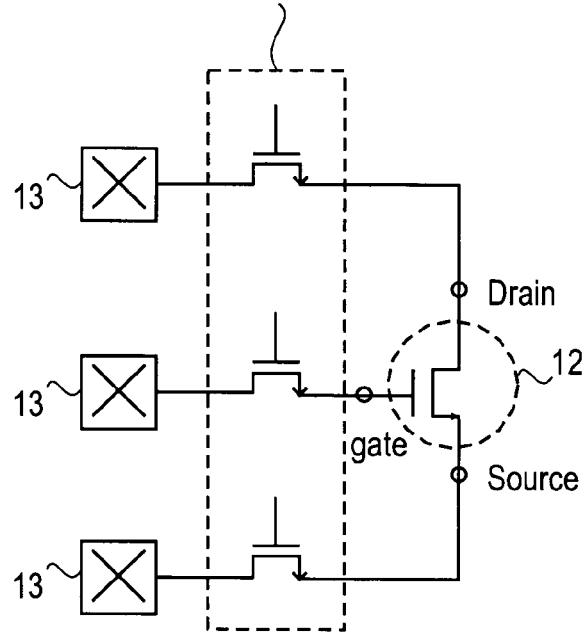
FIG. 2A is a schematic diagram of a transistor in the APSM of FIG. 1 connected to the pads of the die through a set of passgates.
Figure 2B:
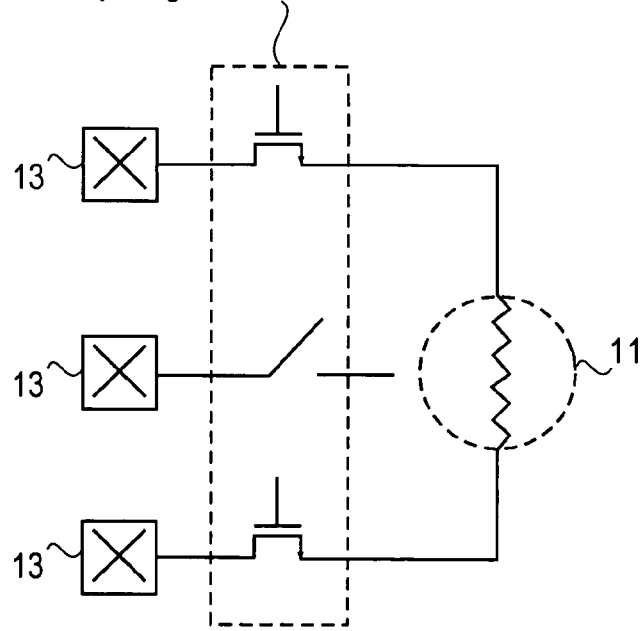
FIG. 2B is a schematic diagram of a resistor in the APSM of FIG. 1 connected to the pads of the die through a set of passgates.

FIG. 2A and 2B are simplified diagrams showing a duplicated component (a transistor 21 in FIG. 2A and a resistor 22 in FIG. 2B) connecting to pads 13 through selection/isolation passgates 24. Each of multiplexers 16, 17, 18 (FIG. 1) comprises a plurality of passgates 24, each passgate connecting an end of a duplicated component to one of pads 13. Thus, passgates 24 in the dotted box of FIG. 2A, from top to bottom, may be formed by multiplexers 16, 17, and 18, each contributing to a single connection. Each passgate 24, when selected, form a signal path to connect an end of the duplicated component to pad 13. Unselected passgates 24 are equivalent to open switches that isolate a connecting end of a component from pads 13. Only one of passgates 24 in each multiplexer 16, 17, 18 is selected to form a signal path at a time. Voltages or currents may be applied to pads 13 to cause an electrical flow into a duplicated component, and measurements of analog characteristics may be made at one end of the duplicated component. As each duplicated component is selectively but directly connected to pad 13 through passgates 24, the characteristic of a single component may be obtained.

The APSM 15 may include calibration components to calibrate the loss experienced by the measurement path (e.g. measurement connection cables, connectors, jumpers, pads/pins, multiplexers, etc.). In one embodiment, referring to FIG. 1, a first metal short (not shown) may connect multiplexer 16 to multiplexer 17, and a second metal short (not shown) may connect multiplexer 17 to multiplexer 18. These metal shorts may be selected, in lieu of the duplicated components, in the same manner as the duplicated components. When selected, the metal short may be used to measure the voltage drop through the measurement path without the presence of a duplicated component. In a separate measurement, a duplicated component connecting to the same multiplexers may be measured. This voltage drop measured by the metal short can then be subtracted from the measurement of the duplicated component, or all the measurement data can be normalized to this metal short current.

Figure 3A:
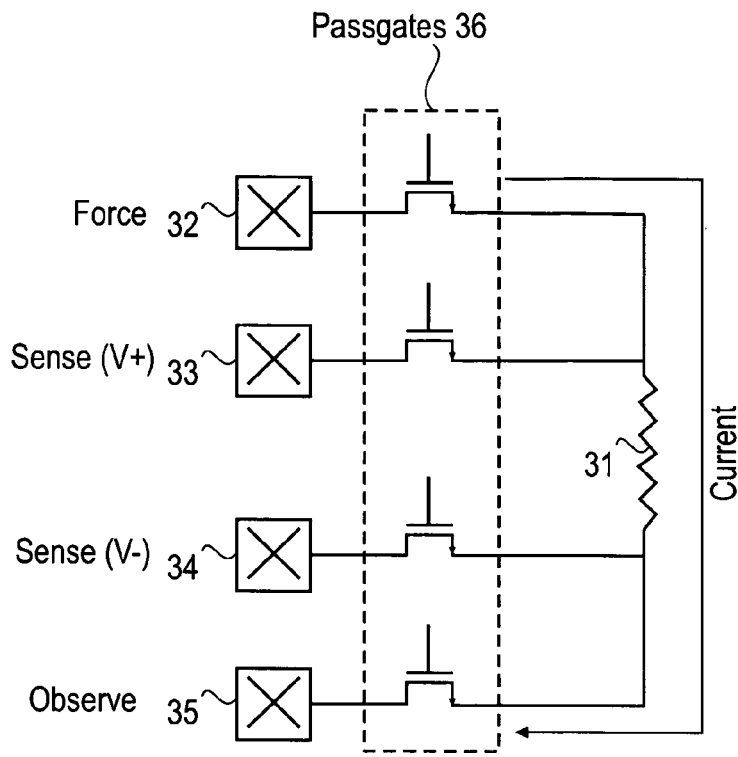
FIG. 3A and FIG. 3B are schematic diagrams of a resistor and a transistor in another embodiment of the APSM that includes four-point probing.
Figure 3B:
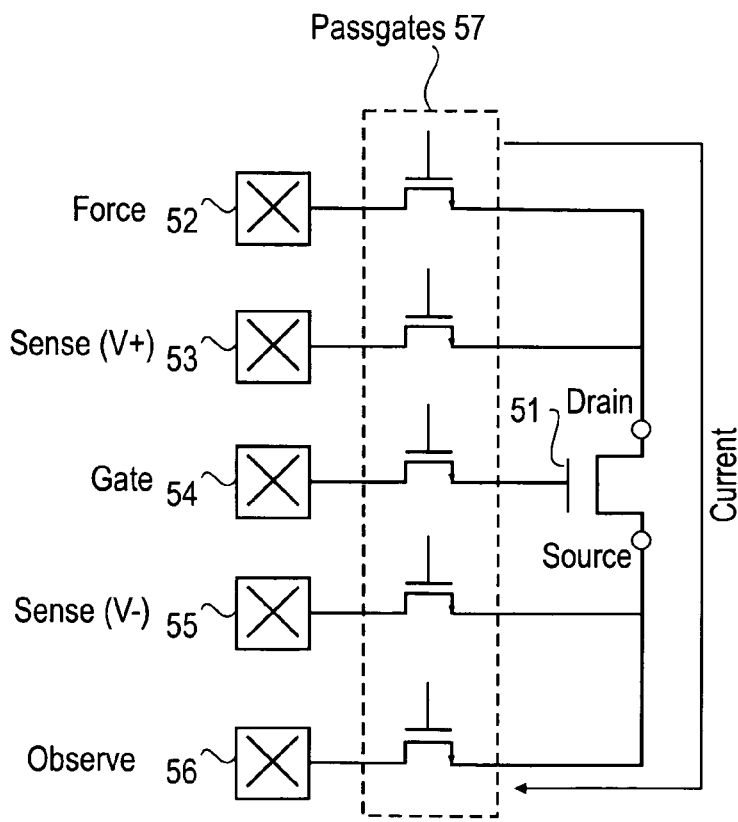

In alternative embodiments, four-point probing (also know as Kelvin probing) may be implemented in APSM 15 to calibrate the voltage drop in the measurement path. Although only a resistor and a transistor are shown in FIGS. 3A and 3B, the four-point probing may be applied to any duplicated component including, but not limited to: a diode, a capacitor, or any other circuit components. Referring to FIG. 3A, resistor duplicate 31 is connected to four pads 32, 33, 34, 35, two at each end, through four multiplexers (represented by four passgates 36). Pads 32 and 35 provide a current path through resistor duplicate 31. Pad 32 (labeled "Force") is used to force a current flowing through resistor duplicate 31 and pad 35 (labeled "Observe") is used to observe or measure the current. Pads 33 and 34 (labeled "Sense") are connected to high-impedance ports of an external measurement device (not shown), which observe or sense the voltage at the opposite ends of resistor duplicate 31. The sensed measurements may be taken at the same time when characteristics of resistor duplicate 31 are measured. The sensed measurement can be used to compensate for the loss experienced in the measurement path.

Referring to FIG. 3B, four-point probing may be applied to a transistor duplicate 51. Transistor duplicate 51 is connected to pads 52, 53, 54, 55, 56, through five multiplexers (represented by five passgates 57). Pad 52 ("Force") and pad 56 ("Observe") are connected to the source and drain to provide a current path. Pads 53 and 55 are connected to high-impedance ports of an external measurement device, which observe or sense the voltage at the drain and source of transistor duplicate 51. Pad 54 is connected to the gate of transistor duplicate 51. As the gate path normally has high resistance and the loss is usually insignificant, the gate path is not subject to the calibration.

An external tester or measurement device (not shown) may be connected to die 10. In one embodiment, the external tester may generate the particular state or sequence of states to trigger the APSM test mode in DFT unit 110 as described earlier. The external tester then reconfigures these pads/pins to a particular state, DFT unit 110 configures device selector logic 19 to select a particular duplicated component. The external tester then manipulates pads 13 by supplying voltages or currents to perform desired tests on the selected duplicated component. The external tester may be used at a wafer level and after die 10 is packaged into an IC. The external tester may be automated to perform pre-configured tests.

Figure 4:
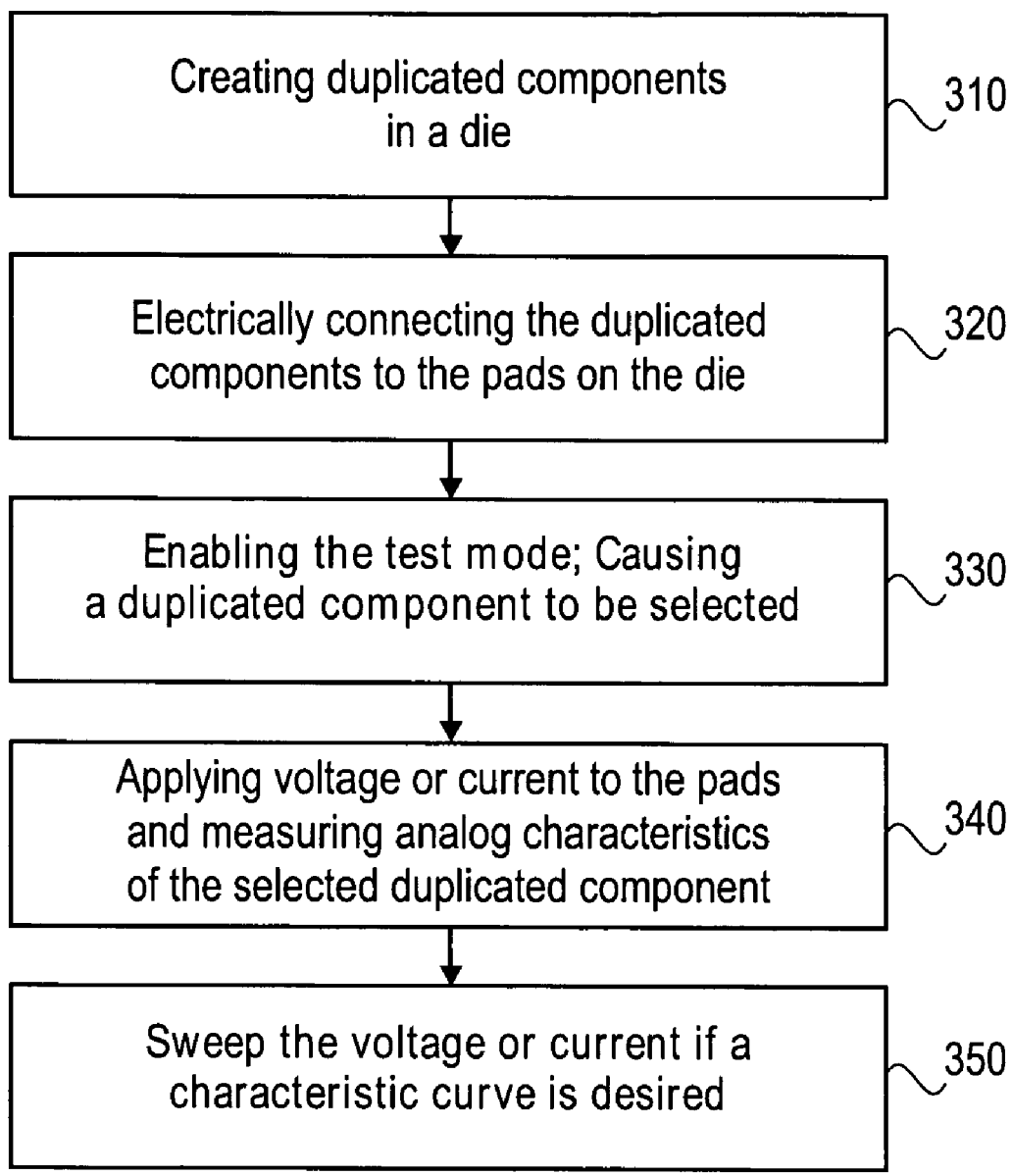
FIG. 4 is a flowchart showing an embodiment of a process for measuring analog characteristics of components in the die of FIG. 1.

FIG. 4 is a flowchart showing an embodiment of a method for measuring analog characteristics of a duplicated microelectronic component. At block 310, APSM 15 (FIG. 1) including duplicated components is created in a die. The duplicated components are physically located on the same die as the corresponding operational components and fabricated by the same process at the same time. At block 320, components of APSM 15, as well as operational components 14, are connected to the pads of die 10 to allow access by external devices. At block 330, an APSM test mode is enabled and a selector control signal to device selector logic 19 is generated to cause appropriate mux control signals to be generated. Thus, a duplicated component is selected and electrically-conducting paths are formed to the duplicated component. Input buffers 112 and output buffers 114 are disabled from pads 13. At block 340, electricity (e.g., voltage or current) of a pre-determined value is applied to one or more of pads 13, and an analog characteristic is measured at another of pads 13. Optionally at block 350, if a characteristic curve is desired, sweep the voltage or current applied to one of pads 13 and measure the characteristics at another of pads 13.

Figure 5:
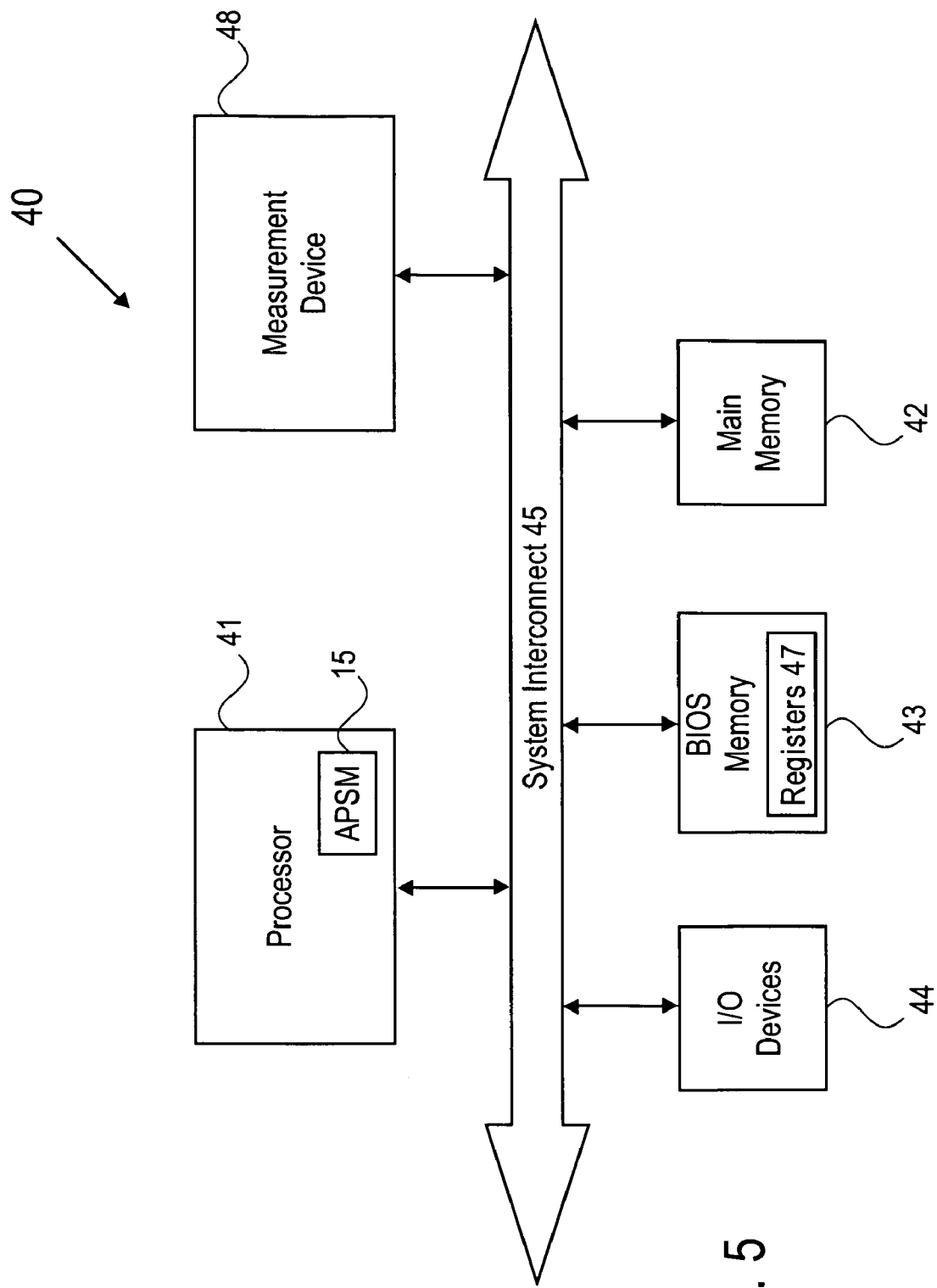
FIG. 5 a block diagram of an embodiment of a system block diagram comprising a device having the embedded APSM of FIG. 1.

FIG. 5 shows an embodiment of an electronic system 40 in which analog characteristics of the components in a packaged IC may be monitored. System 40 includes a processor 41 coupled to a main memory 42, a BIOS (Basic Input Output System) memory 43 (e.g., a flash memory), and I/O devices 44 via a system interconnect 45 (e.g., a bus or a point-to-point connection). System 40 may also include additional electronics devices not shown in FIG. 4. At least one of the electronic devices in system 40 comprises a die having an embedded APSM, e.g., APSM 15 of FIG. 1. In the embodiment as shown, processor 41 may be a single die device that contains APSM 15.

A platform-level test/measurement may be performed on the die containing the APSM 15. In one embodiment, system 40 may generate control signals internally and use external measurement device 48 for measurement purposes only. A configuration write to BIOS registers 47 or any other registers may trigger the APSM test mode and generate selector control signal for device selector logic 19. In another embodiment, external measurement device 48 is directly connected to system interconnect 45 to enable the APSM test mode, control the pins that are routed to device selector logic 19, and supply voltages or currents to the processor pins used by APSM 15. A jumper circuit (not shown) may be used to disconnect the processor pins from normal operational connections and to form a conducting path to external measurement device 48. Alternatively, both control and measurement may be performed with system 40 without requiring any external devices. A tester card (not shown) may be placed on the motherboard of the DUT (e.g., processor 41) to supply voltages or currents required for the test, and collect test outputs from the output pins. Using the techniques described above and variations of these techniques, analog characteristics of a single component may be measured and identified.

A chip manufacturer may use the measurement to determine whether a component of interest is fabricated to meet a specification when the chip is still on a wafer. If it is not, the chip may be discarded without incurring further packaging cost. A system operator may also measure the characteristics even after the chip is packaged, soldered to a board, and placed into a system. The measurement may serve diagnostic purposes when there is an anomaly in the chip that causes a failure. The measurements may be used for platform diagnosis, debugging, and chip performance monitoring.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense

What is claimed is:

1. A method comprising:
    disabling access to an operational circuit on a die, which is an integrated circuit chip that contains both the operational circuit and a test circuit, the operational circuit sharing same pads with a test circuit that includes a plurality of duplicated components that are duplicates of circuit components in the die;
    selecting, with one or more multiplexers, from the plurality of duplicated components a selected duplicated component;
    electrically connecting ends of the selected duplicated component to the pads on the die;
    applying electricity to the pads to measure characteristics of the selected duplicated component; and
    calibrating a loss in a signal path defined by the selected duplicated component.

2. The method of claim 1 wherein selecting from the plurality of duplicated components a selected duplicated component further comprises:
    connecting each of the ends of the selected duplicated component to one of the pads through one of the multiplexers to form a signal path.

3. The method of claim 1 further comprising:
    triggering a test mode before applying the electricity by performing a configuration write into Design for Testability Unit configuration registers.

4. The method of claim 1 further comprising:
    triggering a test mode when a number of the pads on the die are in a predefined state or a predefined sequence of states.

5. The method of claim 1 further comprising:
    calibrating a loss in a signal path defined by the selected duplicated component by subjecting the selected duplicated component to a four-point probing.

6. The method of claim 1 further comprising:
    calibrating a loss in a signal path defined by the selected duplicated component by first measuring a voltage drop in a short circuit connected to the multiplexers in lieu of the selected duplicated component.

7. The method of claim 1 wherein applying electricity further comprises:

measuring analog characteristics of the selected duplicated component.

8. The method of claim 1 wherein applying electricity further comprises:
applying electricity to the pads at a wafer level and at a platform level.

9. The method of claim 1, wherein the duplicated components include at least one component from the following: a resistor, a transistor, a diode, and a capacitor.

10. The method of claim 1, wherein disabling access to an operational circuit further comprises:
tristating output buffers associated with the pads to disable the operational circuit from driving the pads.

11. The method of claim 1, wherein disabling access to an operational circuit further comprises:
disabling input to the operational circuit or logically gating an output of input buffers associated with the pads.

* * * * *